United States Patent [19]

Okayama

[11] 4,071,823
[45] Jan. 31, 1978

[54] TWO-WIRE TYPE AMPLIFIER
[75] Inventor: Tsutomu Okayama, Katsuta, Japan
[73] Assignee: Hitachi, Ltd., Japan
[21] Appl. No.: 701,201
[22] Filed: June 30, 1976
[30] Foreign Application Priority Data
 July 4, 1975 Japan .................................. 50-81800
[51] Int. Cl.² ...................... G01R 1/30; G01R 27/02
[52] U.S. Cl. ............................ 324/123 R; 324/65 R; 330/69
[58] Field of Search ................... 324/123 R, 65 R; 330/69, 30 D; 73/88.5
[56] References Cited
 U.S. PATENT DOCUMENTS
 3,629,719 12/1971 Heller et al. ......................... 330/69
 3,825,852 7/1974 Pinckaers ......................... 330/30 D Primary Examiner—Rudolph V. Rolinec
Assistant Examiner—Ernest F. Karlsen
Attorney, Agent, or Firm—Craig & Antonelli

[57] ABSTRACT

Two differential amplifiers are provided each having two input terminals. One of the input terminals of each differential amplifier receives an output signal derived from a measuring circuit, while the other terminals of the differential amplifiers are coupled to each other. Output signals of the respective differential amplifiers control correspondingly two series-connected current control circuits, respectively. With such a circuit arrangement, a current flowing through a receiving unit connected in series to the two current control circuit is controlled in response to the output signal from the measuring circuit.

5 Claims, 10 Drawing Figures

TWO-WIRE TYPE AMPLIFIER

BACKGROUND OF THE INVENTION

1. Field of the Invention

This invention relates to a two-wire type amplifier suitable for transmitting a combination of an electric power and a signal current through the same line.

2. Description of the Prior Art

The two-wire type amplifier is used for transmitting a detected signal in the form of current converted by a remote receiving unit. The detected signal is produced through a detection by a detector of various quantities measured in industrial processes. The two-wire type amplifier uses a single two conductor cable for the transmission of electric power and for signal transmissions, and does not necessitate separate cables exclusively used for the respective electric power and signal transmissions. Thus, the number of cables necessary is greatly reduced and, hence, the two-wire type amplifier is now prevailingly employed for measurements in industrial processes.

With improvements of the performance of differential amplifiers resulting from a remarkable development of semiconductor techniques, the two-wire type amplifier may be constructed by using integrated circuit differential amplifiers even if the detector produces a relatively large output.

In general, a single integrated circuit differential amplifier has been used as the differential amplifier used in the two-wire type amplifier.

There is an example of the signal detecting circuit using a plurality of semiconductor strain gauges arranged in a bridge. In this example, the mechanical distortions of the semiconductor strain gauges produced by an external force applied to them are transformed into the resistance changes of the respective gauges. These resistance changes are derived from the bridge circuit in the form of the corresponding voltage changes which in turn is inputted to the two-wire type amplifier.

Such a two-wire type amplifier exhibits a steady operation when it is subjected to a small variation of ambient temperature. When it is subjected to a large variation of ambient temperature, however, the signal current produced is different with respect to the same distortion. This is a fatal disadvantage.

The reason for this is that the temperature coefficients of semiconductor strain gauges and resistors both constituting a bridge circuit are different from those of the feedback resistor for feeding back a part of the output signal of the differential amplifier to the bridge circuit connected at the input side of the differential amplifier.

Thus, when the temperature coefficients of the feedback resistors are different from those of the strain gauges, even if those of the strain gauges are equal, the voltage drop across feedback resistor exhibits a different value with respect to the same external pressure, if the ambient temperature changes. As a result, the signal current from the two-wire type amplifier also changes, which in turn gives errors.

Further, in the conventional amplifier, the voltage fed from the measuring circuit to the differential amplifier must be within the operating voltage range (generally, a positive and negative voltages) of the differential amplifier. For this, a high resistance resistor must be connected to the input side of the differential amplifier. The high resistance resistors must be those of a high precesion type, with a very small temperature coefficient and a little dispersion.

Thus, the precision of the conventional amplifier using a differential amplifier largely depends particularly on the temperature coefficient of the high resistance resistor. Various compensating circuits for compensating for the temperature coefficient error have been devised, but they are complicated in circuit construction and insufficient in their compensating performance.

Another problem of the conventional amplifier resides in that there is a dispersion in the temperature coefficients of the differential amplifiers per se. More precisely, an off-set voltage appears at each of two input terminals of the differential amplifier when ambient temperature changes, although these off-set voltage must essentially be zero. The off-set voltage is adversely different each differential amplifier.

This means that, in manufacturing the two-wire type amplifier, the differential amplifier with its off-set voltage within a predetermined value range must be selected from a large sample of amplifiers, in order to secure a predetermined precision of the amplifier. This selection process is very time consuming and thus the selected amplifiers are very expensive.

SUMMARY OF THE INVENTION

Accordingly, an object of this invention is to provide a two-wire type amplifier in which an input voltage is converted into a stable current signal for transmission thereof.

Another object of this invention is to provide a two-wire type amplifier of which the output signal is insensitive to the changes in ambient temperature.

Still another object of this invention is to provide a two-wire type amplifier without necessitating a superfluous selection process of its circuit components.

A two-wire type amplifiers according to this invention is such that a pair of differential amplifiers are provided, each of which has a pair of input terminals, with one of the input terminals of each differential amplifier receiving an output signal derived from a measuring circuit, while the other terminals of the respective differential amplifiers being coupled to each other. The output signals of the individual differential amplifiers control two series-connected current control means, respectively, which are connected in series to a receiving unit comprising a receiving resistor and a power source connected in series, with the current of the power source is controlled by the two current control means.

Other objects and features of this invention will be apparent from the following description taken in connection with the accompanying drawings.

DESCRIPTION OF THE PREFERRED EMBODIMENTS

Figure 1:
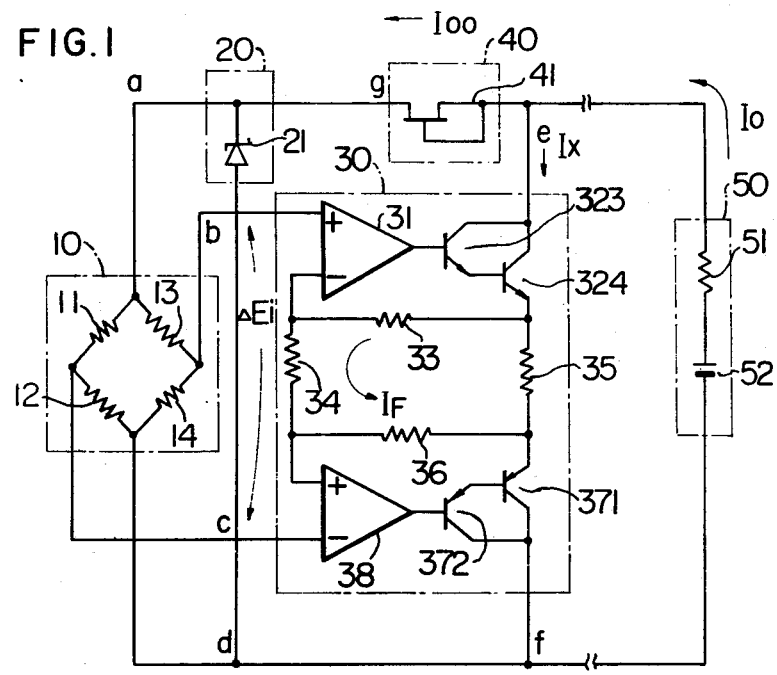
FIG. 1 shows a circuit diagram of an embodiment of a two-wire type amplifier according to this invention.

Reference is now made to FIG. 1 illustrating an embodiment of a two-wire type amplifier according to this invention in which a measuring circuit comprises a bridge circuit consisting of four strain gauges 11 to 14.

A constant voltage circuit generally designated by reference numeral 20 comprises a constant voltage diode 21 and controls the voltage between points $a$ and $b$ so as to be constant. The constant voltage circuit 20 receives a substantially constant current from a constant current circuit generally designated by reference numeral 40 comprising a field effect transistor 41 with the gate connected to the source, with the current supplied by the circuit being constant irrespective of changes of the electric power fed to it. An amplifying circuit generally designated by reference numeral 30 comprises a pair of differential amplifiers 31 and 38, npn transistors 323 and 324, pnp transistors 371 and 372, and four resistors 33 to 36. In FIG. 1, the pnp transistor pairs and the npn transistor pairs are each connected in a Darlington configuration. Although power supply terminals to the differential amplifiers 31 and 38 are not illustrated in the drawing, the voltages at the respective points $a$ and $d$ are fed to the differential amplifiers. Reference numeral 50 designates a receiving unit comprising a receiving resistor 51 and a DC power source 52. The circuit components 10, 20, 30, and 40, described above, constitute a two-wire type amplifier for converting various values measured in an industrial process into current signals. The receiving unit 50 represents a power source and a receiving resistor, e.g. an internal resistor of an adjusting meter or an indicator.

The operation of the two-wire type amplifier stated above will be described with reference to FIG. 2. For convenience of explanation, the resistors 34 and 35 shown in FIG. 1 are divided into two resistors 341 and 342, and 351 and 352, respectively. The voltage between the points $a$ and $d$ also is divided into two signal voltages 01 and 02.

Figure 2:
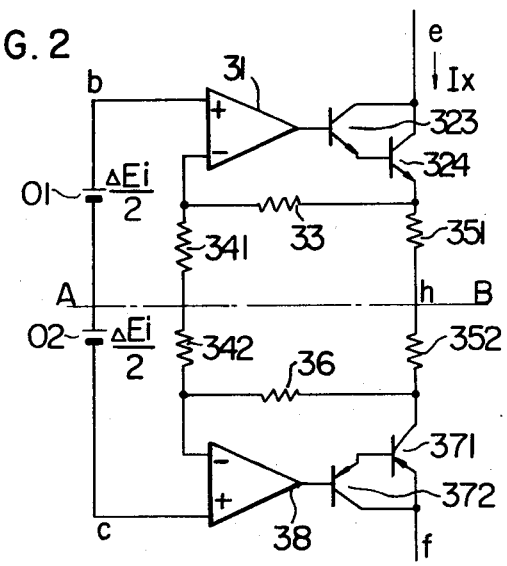
FIG. 2 is a schematic circuit diagram for explaining the operation of the converting amplifier of FIG. 1.

With such an illustration, the circuit diagram in FIG. 2 is symmetrical with respect to the alternate long and short dash line AB. The next explanation will be given about the operation of the upper half part of the circuit diagram above the line AB.

The voltage $\Delta Ei/2$ of the signal voltage 01 is applied to the (+) terminal of the differential amplifier 31 whose output is applied to the base of the post stage transistor 323 connected in the Darlington configuration. In case where the voltage at the (−) terminal of the differential amplifier 31 is lower than that at the (+) terminal, a positive voltage is applied to the base of the transistor 323 so that the current flowing in the direction $e$ to $h$ increases. This current produces a voltage difference across the resistor 351. At this time, the potential at the emitter side of the transistor 324 is higher than that at the point $h$. Thus, the potential at the emitter side is fed back through the resistor 33 to the (−) terminal of the differential amplifier 31, so that the potential at the (−) terminal increases. It is noted, here, that, in the inverse case, the potential at the (−) terminal decreases.

With the feedback by the resistor 33, in the upper half circuit just mentioned, the voltage across the resistor 341 instantaneously increases to reach the signal voltage 01 due to the current increase mentioned above. The two transistors in the Darlington configuration have a very high current amplification factor. Therefore, the current fed from the point $e$ is proportional to the signal voltage 01. The lower half circuit also operates in a similar manner, but the current flows in the upper-to-lower direction as in the drawing.

Assume now that the resistor (hereinafter referred to just as R) 351 is equal to R352, R341 = R342 and R33 = R36. In this case, the currents flowing through R341 and R342 are equal, and this is true for the currents flowing through R33 and R36, and R351 and R352. This circuit is operable if it is connected as shown in the drawing without separating it along the line AB.

That is, the current Ix, proportional to the signal voltage between the points $b$ and $c$, flows through the $e$ to $f$ circuit.

If the input resistors and voltage amplification factors of the differential amplifiers 31 and 38 are sufficiently high, the voltage across the input terminals (+) and (−) of the differential amplifier 31 is substantially zero, since the feedback is applied to the amplifier. This is true in the case of the differential amplifier 38. Accordingly, E$i$ of the voltage between the points $b$ and $c$ is applied across the resistor 34. Since the current flowing into the input terminals of the differential amplifiers is negligible, the equation E$i$ = $I_F \times$ R34 holds with designation of $I_F$ of the current of the resistor 34.

The current $I_F$ flows through the resistors 33, 34 and 36 because of series connection of these resistors. Accordingly, the voltage applied across the resistor 35 is expressed by $I_F \times$ (R33 + R34 + R36). Since the base currents of the transistors 323 and 372 are very small, the current Ix flowing through the $e$ to $f$ circuit is given by the equation $$Ix = \Delta Ei/R34 \,(1 + R33 + R34 + R36/R35)$$

The current Io flowing through the receiving resistor 51 is the sum of the current Ix and the current Ioo of the constant current circuit 40. That is, $$Io = \Delta Ei/R34 \,(1 + R33 + R34 + R36/R35) + Ioo$$

From the foregoing description, it will be seen that the unbalance voltage $\Delta Ei$ of the bridge circuit is converted into the DC current signal.

As described above, according to the embodiment of this invention, even if a change occurs in the impedance of the measuring circuit 10 and in the resistance of each resistor of the amplifier circuit including the feedback resistor, the twin differential resistors each operates differentially. Therefore, the two-wire type amplifier produces an output characteristic exhibiting a good linearity and being proportional to the input voltage.

Further, in this example, even if the output current of the two-wire type amplifier changes, no change of potential is produced at the input terminals ($b$ and $c$ points) of the differential amplifiers. Thus, this example satisfies a requirement that the voltage between the points $b$ and $c$ must be always within the operating range of the differential amplifier. This obviates the need of high resistance resistors used in the measuring circuit for satisfying that requirement of the conventional problem. Therefore, an error in the output signal due to the difference of the temperature coefficients of the high resistance resistors used is eliminated.

As described above, the two-wire type amplifier of this invention can convert only the input voltage into a current signal. It will be understood, therefore, that, in addition to the unbalance voltage of the bridge circuit, the amplifier just with an additional simple bias circuit can convert measured values obtained through a change of electromotive force or resistance.

Figure 3:
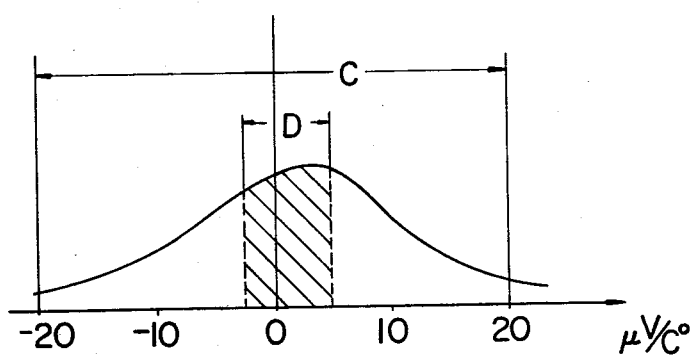
FIG. 3 is a graph for illustrating the temperature coefficient of the drift voltage of an integrated circuit differential amplifier.

Referring now to FIG. 3, there is shown a distribution of the off-set voltage at the input of an integrated circuit differential amplifier with respect to the temperature coefficients. In the drawing, a number of differential amplifiers are depicted along the y-axis.

It is said that conventional two-wire type amplifiers will have a problem of accuracy in practical use unless the temperature coefficient of the input off-set voltage of the differential amplifier is below several $\mu v/^\circ$ C when the input voltage of the amplifier is several tens of mV. This means that the differential amplifier employed in the two-wire type amplifier must be only ones of which the input off-set voltages have temperature coefficients existing in the shadowed portion in FIG. 3, i.e. the area D, and such differential amplifiers must be selected from many. In the conventional amplifier, the yield used for selecting the necessary differential amplifiers was very low, i.e. about 35%. On the other hand, in the amplifier of this invention, the difference existing between the input off-set voltages of the differential amplifiers are cancelled with each other, if the temperature coefficients are substantially equal, with the result being that there are only small errors caused by a temperature change. Additionally, there is no need further selection of such a differential amplifier having a temperature coefficient within a predetermined range as in the case of conventional two wire amplifiers. That is, the two wire amplifier according to this invention permits the use of most of the differential amplifiers (approximately 95% of yield) whose temperature coefficients fall within the area C in FIG. 3.

Therefore, the two-wire type amplifier is capable of stably amplifying even a lower level signal, by using integrating circuit differential amplifiers easily available and with no selection loss, thereby further enlarging the measuring range.

Moreover, the two-wire type amplifier of this invention eliminates the need of the high resistance, resistors necessarily used in conventional two wire amplifiers. This enables the operating voltage range of the amplifier to be lower by the amount of the voltage drop produced by the high resistance resistors. This means that, according to this invention, a large load may be used even in completely explosion-proof type systems requiring a low voltage operation or other systems such as ones using an auxiliary power source such as a battery during power stoppages.

Many types of measuring circuits 10 may be used with the two-wire type amplifier of this invention.

Figure 4:
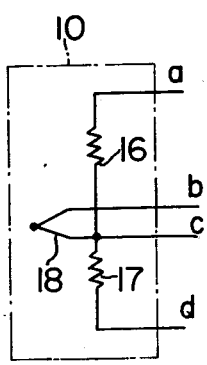
FIGS. 4 to 6 show some examples of measuring circuits.
Figure 5:
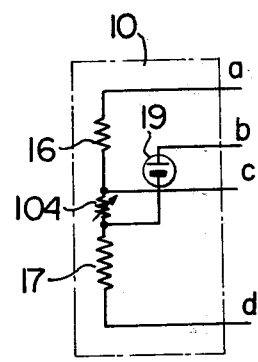
Figure 6:
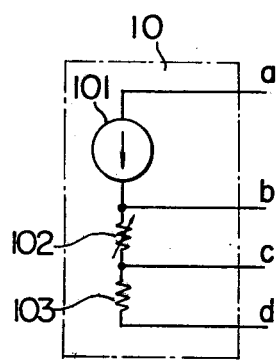

FIG. 4 shows an example of the measuring circuit using thermocouple as a detector. In the figure, bias resistors 16 and 17 are used for providing between points c and d a voltage which is enough to operate the amplifier circuit. FIG. 5 shows a measuring circuit in which measured values are given in the form of electromotive force 19 and a difference between a reference voltage and the electromotive force is produced for amplification, and the reference voltage is adjustable through means of a zero adjusting resistor 104. FIG. 6 shows a measuring circuit for measuring the resistance of a variable resistor 102 in which a constant current source 101 and a bias resistor 103 are connected in series with the variable resistor 102.

The measuring circuit of FIG. 6 may constitute a float type liquid level meter when the adjusting bar of the variable resistor 102 is interlocked with a float. In FIGS. 4 to 6, connection of the measuring circuit to amplifier circuit is omitted since it is much the same as that in FIG. 1.

It will be seen from the foregoing description that, just by changing only the measuring circuit in accordance with the type of the detector, measured values obtained from various detectors may easily be converted into two-wire type signals.

It is to be noted further that the amplifier mentioned above is commonly used except the measuring circuit included therein. Thus, this invention, of course, provides an excellent effect from the viewpoint of maintenance and manufacture.

The resistors 33 to 36 shown in FIG. 1 are so arranged that the voltage across the resistor 35 is fed back to one of the input terminals of each of two differential amplifiers, and, when the differential amplifiers operate in a steady state, the (+) and (−) terminals of each differential amplifier are at the same potential. There are many variations of this construction as described below. Connections other than that in FIG. 1 are possible if one uses different kinds of transistors or changes the method of input signal introduction to the differential amplifiers.

Figure 7:
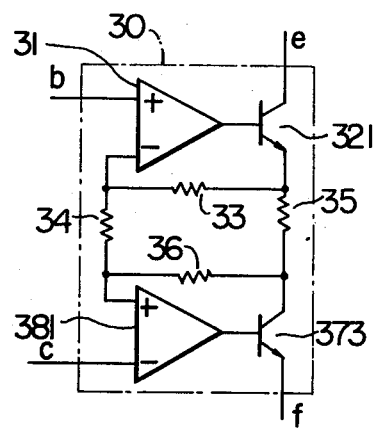
FIGS. 7 to 10 show some modifications of twin differential amplifiers employed in a two-wire type amplifier according to this invention.
Figure 8:
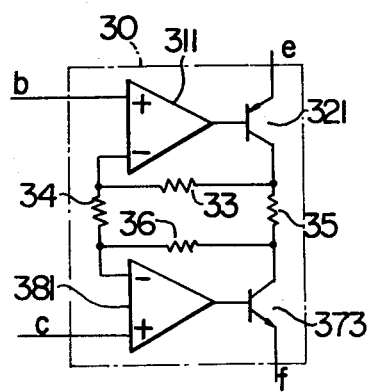
Figure 9:
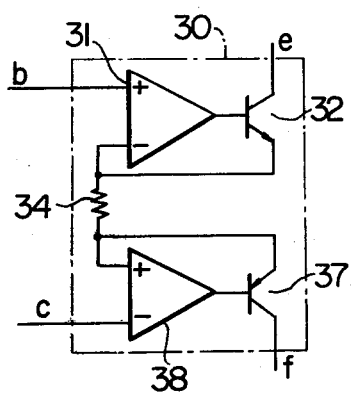

FIGS. 7 to 9 show differential amplifier circuits each having a characteristic equivalent to the amplifying circuit 30 shown in FIG. 1. In these figures, alphabetical letters b to f designate the same points as those in FIG. 1.

FIG. 7 shows an example of another amplifier circuit in which only npn transistors are used to constitute an amplifying circuit and differential amplifiers 381 and 31 are connected at their (+) and (−) terminals to each other and these form feedback circuits in combination with the corresponding transistors 373 and 321, respectively. FIG. 8 is another example of the amplifier circuit in which input terminals b and c are connected with the (+) terminals of the differential amplifiers 311 and 381, respectively.

Figure 10:
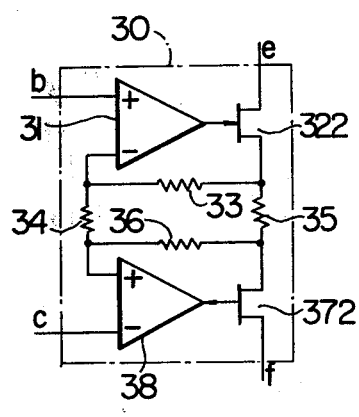

FIG. 9 is other example of the amplifier circuit in which the resistors 33, 35, and 36 employed in the previous examples are omitted and the same voltage as the input voltage between the terminals b and c is applied across the resistor 34. In those examples of FIGS. 7 to 9, the npn or pnp transistor equivalent to those connected in the Darlington configuration will suffice for each transistor used. FIG. 10 is an amplifier circuit using a field effect transistors in place of the transistors of the type used in the previous examples.

As described above, this invention enables the two-wire type amplifier to obtain a stable characteristic. Further, this invention permits detecting devices other than semiconductor strain gauges to be used for a two-wire type amplifier. This apparently leads to high productivity.

I claim:

1. A two-wire type amplifier comprising:
    a measuring circuit, having two output signals, to measure quantities to be measured;
    first and second differential amplifiers, each having first and second input terminals;
    one of the output signals derived from said measuring circuit being coupled to the first input terminal of said first differential amplifier, with the other output signal being coupled to the first input terminal of said second differential amplifier;

first and second current control means being connected in series and controlled by said first and second differential amplifiers, respectively and wherein said first and second current control means are connected in series via a common resistor and further comprising feedback means for feeding back the voltage across said common resistor to the respective second input terminals of said first and second differential amplifiers;

receiving means including a receiving resistor and a power source connected in series with said series-connected first and second current control means; and said first and second current control means controlling said power source current.

2. A two-wire type amplifier according to claim 1, wherein said first and second current control means each comprise more than one transistor.

3. A two-wire type amplifier according to claim 2, wherein said transistors of each current control means are connected in a Darlington configuration.

4. A two-wire type amplifier according to claim 1, wherein said first and second current control means each comprise a field effect transistor.

5. A two-wire type amplifier according to claim 1, wherein said measuring circuit comprises a bridge circuit, and the voltage across said receiving means is applied across the power source terminals of said bridge circuit, with the connection of a constant current and a constant voltage circuit between said receiving circuit and said bridge circuit.

* * * * *